United States Patent
Toujo

(10) Patent No.: US 12,301,197 B2
(45) Date of Patent: May 13, 2025

(54) FILTER CIRCUIT AND POWER SUPPLY DEVICE INCLUDING THE SAME

(71) Applicant: Murata Manufacturing Co., Ltd., Nagaokakyo (JP)

(72) Inventor: Atsushi Toujo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 283 days.

(21) Appl. No.: 17/986,942

(22) Filed: Nov. 15, 2022

(65) Prior Publication Data
US 2023/0071624 A1 Mar. 9, 2023

Related U.S. Application Data

(63) Continuation of application No. PCT/JP2021/025589, filed on Jul. 7, 2021.

(30) Foreign Application Priority Data

Jul. 13, 2020 (JP) .................. 2020-120127

(51) Int. Cl.
*H03H 7/09* (2006.01)
*H02K 11/01* (2016.01)
*H03H 7/01* (2006.01)

(52) U.S. Cl.
CPC .............. *H03H 7/09* (2013.01); *H02K 11/01* (2016.01); *H03H 7/0138* (2013.01); *H03H 7/175* (2013.01)

(58) Field of Classification Search
CPC ...... H01F 5/04; H01F 17/0013; H01F 27/292; H01F 2017/0026; H02K 11/01; H03H 7/09; H03H 7/1758; H03H 7/1708; H03H 7/0138; H03H 7/175; H03H 2001/0085
See application file for complete search history.

(56) References Cited

U.S. PATENT DOCUMENTS

| | | | |
|---|---|---|---|
| 6,476,689 B1 | 11/2002 | Uchida et al. | |
| 6,788,169 B1* | 9/2004 | Schemmann | H03H 7/19 333/140 |
| 2015/0162888 A1* | 6/2015 | Yunoki | H03H 7/0161 333/174 |
| 2016/0248450 A1* | 8/2016 | Ishizuka | H04B 1/0053 |
| 2017/0324158 A1* | 11/2017 | Akiyama | H01Q 7/00 |

FOREIGN PATENT DOCUMENTS

| | | |
|---|---|---|
| JP | 2001160728 A | 6/2001 |
| JP | 2005217839 A | 8/2005 |
| JP | 2019220876 A | 12/2019 |
| WO | 2020121592 A1 | 6/2020 |

OTHER PUBLICATIONS

International Search Report in PCT/JP2021/025589, mailed Oct. 5, 2021, 3 pages.
Written Opinion in PCT/JP2021/025589, mailed Oct. 5, 2021, 4 pages.

* cited by examiner

*Primary Examiner* — Quan Tra
(74) *Attorney, Agent, or Firm* — Keating & Bennett, LLP

(57) ABSTRACT

A filter circuit includes a coil component, an inductor, and a capacitor. In the coil component, a first coil and a second coil are magnetically coupled. The inductor is electrically connected to a first end of the first coil and a second end of the second coil and is connected in parallel to the coil component. The capacitor is electrically connected between a ground electrode and an electrode electrically connected to a second end of the first coil and a second end of the coil.

14 Claims, 5 Drawing Sheets

FILTER CIRCUIT AND POWER SUPPLY DEVICE INCLUDING THE SAME

CROSS REFERENCE TO RELATED APPLICATIONS

This application claims the benefit of priority to Japanese Patent Application No. 2020-120127 filed on Jul. 13, 2020 and is a Continuation Application of PCT Application No. PCT/JP2021/025589 filed on Jul. 7, 2021. The entire contents of each application are hereby incorporated herein by reference.

BACKGROUND OF THE INVENTION

1. Field of the Invention

The present disclosure relates to a filter circuit and a power supply device including the filter circuit.

2. Description of the Related Art

Filter circuits are often used to control noise in electronic apparatuses. Such a filter circuit is, for example, an electromagnetic interference (EMI) suppression filter and is configured to pass a necessary component of a current flowing through a conductor and remove an unnecessary component of the current. A capacitor, which is a capacitance element, is used in the filter circuit. It is known that the noise suppression effect of the filter circuit is deteriorated by an equivalent series inductance (ESL) that is the parasitic inductance of the capacitor.

A technique is known for canceling out the equivalent series inductance of the capacitor using a coil component including two magnetically coupled coils, as described in, for example, Japanese Unexamined Patent Application Publication No. 2001-160728). In this technique, a frequency band in which the noise suppression effect of the filter circuit is obtained is broadened by canceling out the equivalent series inductance using a negative inductance generated by the coil component.

SUMMARY OF THE INVENTION

In the case where the noise component of a power supply is removed using a filter circuit, the filter circuit is disposed between divided power supply lines. Accordingly, a coil component included in the filter circuit needs to withstand a current flowing through the power supply lines. In the case where a filter circuit is used for a power supply that supplies a larger current, a measure against large currents, such as the increase in the cross-sectional area of a conductor, needs to be used for a coil component included in the filter circuit.

When a measure against large currents is used for the coil component included in the filter circuit, however, the increase in size of the coil component is limited because of size constraints of the filter circuit and the manufacturing cost of the coil component itself is increased.

Preferred embodiments of the present invention provide filter circuits each capable of passing a large current, and power supply devices including the filter circuits, which each take into consideration the constraints of size and manufacturing cost.

A filter circuit according to a preferred embodiment of the present disclosure includes a coil component including a first coil conductor and a second coil conductor that are magnetically coupled, an inductor that is electrically connected to a first end of the first coil conductor and a first end of the second coil conductor and that is connected in parallel to the coil component, and a capacitor that is electrically connected between a ground electrode and an electrode electrically connected to a second end of the first coil conductor and a second end of the second coil conductor.

A power supply device according to a preferred embodiment of the present disclosure includes a power supply, a power supply line that is connected to the power supply to supply power to a load, and the above-described filter circuit. The filter circuit is connected to the power supply line.

Preferred embodiments of the present disclosure provide filter circuits each capable of passing a large current and power supply devices including the filter circuits, and in which the constraints of size and manufacturing cost are taken into consideration because the inductor is electrically connected to a first end of the first coil conductor and a first end of the second coil conductor and is connected in parallel to the coil component.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Filter circuits and power supply devices according to preferred embodiments of the present disclosure will be described below.

First Preferred Embodiment

Figure 1:
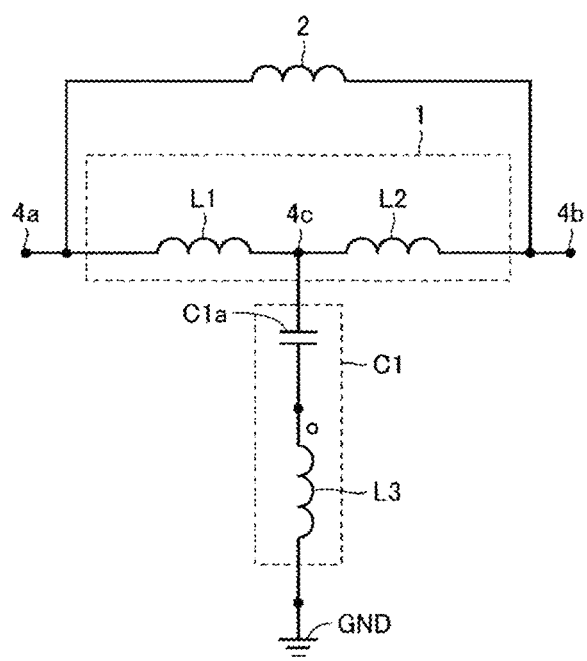
FIG. 1 is a circuit diagram of a filter circuit including a coil component according to a preferred embodiment of the present invention.
Figure 2A:
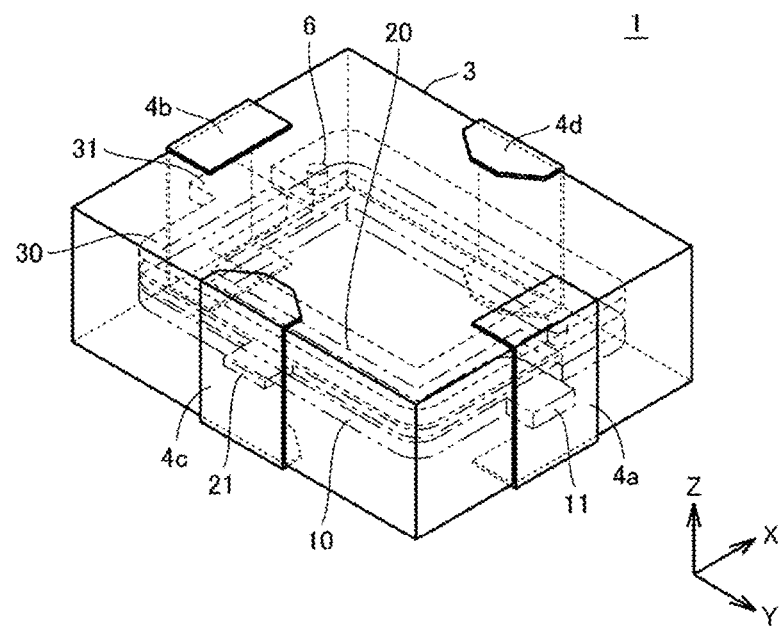
FIGS. 2A and 2B are perspective and side views of a coil component according to a preferred embodiment of the present invention.
Figure 2B:
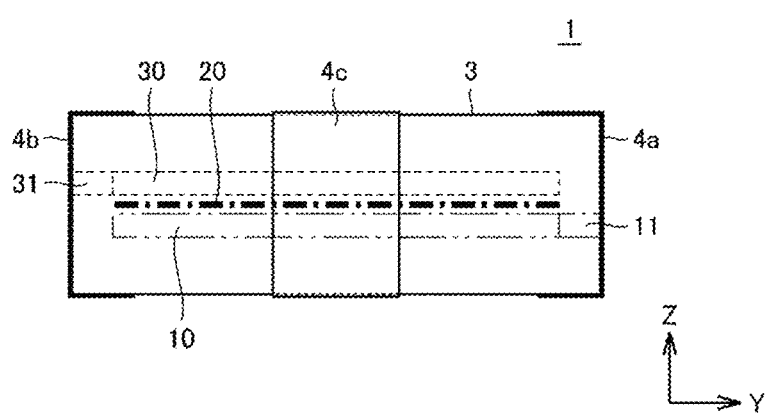
Figure 3A:
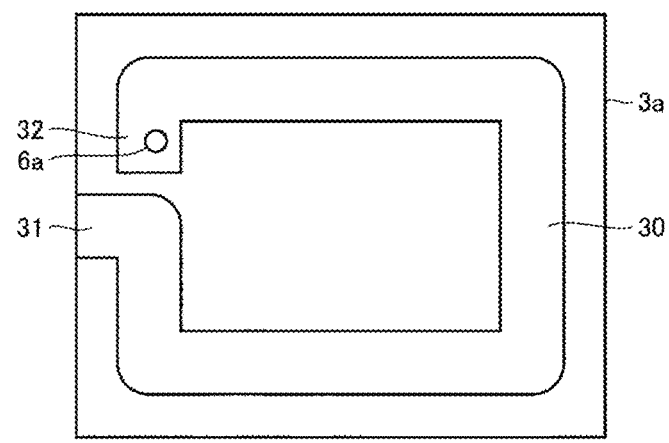
FIGS. 3A to 3C are exploded plan views of a coil component according to a preferred embodiment of the present invention.
Figure 3B:
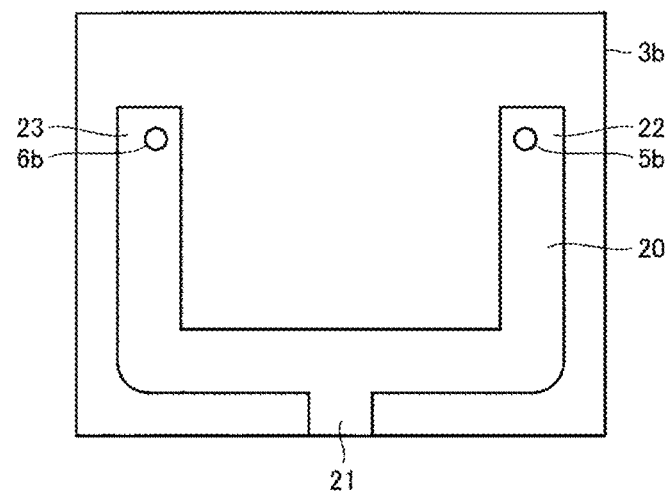
Figure 3C:
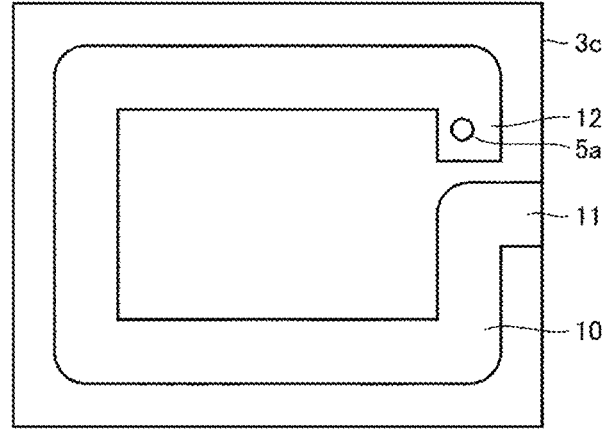

First, a filter circuit according to the present preferred embodiment and a coil component included in the filter circuit will be described with reference to drawings. FIG. 1 is a circuit diagram of a filter circuit including a coil component according to the present preferred embodiment. FIGS. 2A and 2B are perspective and side views of a coil component according to the present preferred embodiment. FIGS. 3A to 3C are exploded plan views of a coil component according to the present preferred embodiment.

A filter circuit 100 is, for example, an EMI suppression filter and is a third-order T-type LC filter circuit. A coil component 1 is included in the filter circuit 100. A third-order T-type LC filter circuit will be described as the filter circuit 100 in the preferred embodiments to be described below, but a coil component having the same configuration can be applied to a five-order or higher-order T-type LC filter circuit. First, the filter circuit 100 includes the coil component 1, an inductor 2, and a capacitor C1 as illustrated in FIG. 1. The coil component 1, the inductor 2, and the capacitor C1 in the filter circuit 100 preferably are provided on a substrate (not illustrated).

In the coil component 1, a coil L1 (first coil conductor) and a coil L2 (second coil conductor) are magnetically coupled. The inductor 2 is electrically connected to one end of the coil L1 and one end of the coil L2 and is connected in parallel to the coil component 1. The capacitor C1 is electrically connected between a GND electrode (ground electrode) and an electrode 4c (third electrode) electrically connected to the other end of the coil L1 and the other end of the coil L2.

The capacitor C1 is not limited to a multilayer ceramic capacitor including $BaTiO_3$ (barium titanate) as a main component and may be a multilayer ceramic capacitor including another material as a main component or another type of capacitor, such as an aluminum electrolytic capacitor other than the multilayer ceramic capacitor. The capacitor C1 includes an inductor L3 as a parasitic inductance (equivalent series inductance (ESL)) and is equivalent to a circuit configuration in which the inductor L3 is connected in series to a capacitor C1a. Although not illustrated, the capacitor C1 may be equivalent to a circuit configuration in which a parasitic resistance (equivalent series resistance (ESR)) is connected in series to the inductor L3 and the capacitor C1a.

In addition to the capacitor C1, the coils L1 and L2 are also connected to the electrode 4c. The coils L1 and L2 are magnetically coupled with each other and generate a negative inductance component. The parasitic inductance (the inductor L3) of the capacitor C1 can be canceled out by using this negative inductance component, and the inductance component of the capacitor C1 can be apparently reduced. The filter circuit 100 including the capacitor C1 and the coils L1 and L2 can improve a high-frequency-band noise suppression effect by canceling out the parasitic inductance of the capacitor C1 using the negative inductance component generated by the mutual inductance between the coils L1 and L2.

However, in the case where the noise component of a power supply is removed using a filter circuit, the filter circuit is disposed between divided power supply lines. Accordingly, the coil component 1 included in the filter circuit 100 needs to withstand a current flowing through the power supply lines. Specifically, in the case where an electrode 4a (first electrode) and an electrode 4b (second electrode) are connected to a power supply line, the current of the power supply line flows through the coils L1 and L2. To allow a larger current to flow through the coils L1 and L2, a measure against large currents, such as the increase in the cross-sectional areas of conductors of the coils L1 and L2, is desired.

In the case where a measure against large currents, such as the increase in the cross-sectional areas of conductors of the coils L1 and L2, is used, the coils L1 and L2 themselves increase in size but have size limitation because of size constraints of the filter circuit. In addition, in the case where a coil portion for which a measure against large currents is used in accordance with the current to flow through the coils L1 and L2 is prepared, the manufacturing cost of the coil component itself is increased.

Accordingly, the inductor 2 is provided which is connected in parallel to the coil component 1 in the filter circuit 100 according to the present preferred embodiment. The inductor 2 is, for example, a chip coil or a ferrite bead electrically connected to one end of the coil L1 and one end of the coil L2. By connecting the inductor 2 in parallel to the coil component 1 in the filter circuit 100, the current of the power supply line can be divided into the current to flow through the coils L1 and L2 and the current to flow through the inductor 2. In the filter circuit 100, a large current can therefore flow through the coil component 1 without using a measure against large currents for the coil component 1. To allow the inductor 2 to simply function as a current bypass path for the coil component 1, it is desired that the coil component 1 and the inductor 2 be disposed on a substrate to prevent the inductor 2 and the coil component 1 from being magnetically coupled. Specifically, it is desired that the coil component 1 and the inductor 2 be disposed on a substrate at respective positions where the opening of a coil conductor (not illustrated) included in the inductor 2 does not overlap the openings of the coils L1 and L2 as viewed from the lamination direction of a laminate 3.

The configuration of the coil component 1 will be described in more detail below. The configuration of the coil component 1 to be described below is an example, and the configuration of the coil component 1 is not limited thereto. The coil component 1 includes the ceramic-layer laminate 3 (ceramic element body) provided by laminating a plurality of substrates (ceramic green sheets) on which coil wiring lines are formed as illustrated in FIGS. 2A and 2B to FIGS. 3A to 3C. The laminate 3 has a pair of main surfaces facing each other and side surfaces connecting the main surfaces. The coils L1 and L2 are parallel to the main surfaces of the laminate 3. The laminate 3 has a first side surface (on which the electrode 4c is located) and a second side surface (on which an electrode 4d is located) on the long side and has a third side surface (on which the electrode 4a is located) and a fourth side surface (on which the electrode 4b is located) on the short side.

In the coil component 1, a wiring line pattern 10, a wiring line pattern 20, and a wiring line pattern 30, which define the coils L1 and L2, are disposed in the laminate 3. The wiring line pattern 10 laminated in a lower layer has one end portion 11 electrically connected to the electrode 4a and the other end portion 12 electrically connected to the wiring line pattern 20 in a middle layer through a via 5. The wiring line pattern 20 laminated in the middle layer has one end portion 22 electrically connected to the wiring line pattern 10 in the lower layer through the via 5 and the other end portion 23 electrically connected to the wiring line pattern 30 in an upper layer via a via 6. The wiring line pattern 20 further has an end portion 21 between the one end portion 22 and the other end portion 23 which is electrically connected to the electrode 4c.

The wiring line pattern 30 laminated in the upper layer has one end portion 31 electrically connected to the electrode 4b and the other end portion 32 electrically connected to the wiring line pattern 20 in the middle layer through the via 6. The coil L1 (first coil conductor) is defined by the wiring line pattern 10 and the wiring line pattern 20 from the end portion 21 to the end portion 22, and the coil L2 (second coil conductor) is defined by the wiring line pattern 30 and the wiring line pattern 20 from the end portion 21 to the end portion 23. In the coil component 1 illustrated in FIG. 2A, the short-side direction is set as the X direction, the long-side direction is set as the Y direction, and the height direction is set as the Z direction. The lamination direction of the substrate is the Z direction with an arrow pointing the direction of the upper layer.

As illustrated in FIG. 2B, the three wiring line patterns 10 to 30 are laminated to define the coil component 1. However, although not illustrated in FIG. 2B, each of the wiring line patterns 10, 20, and 30 is formed by laminating a plurality of wiring lines. The number of laminated wiring lines of the wiring line pattern 20 may be smaller than that of the wiring line patterns 10 and 30. Referring to FIG. 2B, there is a difference in thickness among the wiring line patterns 10 to 30.

The wiring line patterns 10, 20, and 30 are formed on ceramic green sheets 3c, 3b, and 3a(substrates), respectively by performing printing with a conductive paste (Ni paste) using a screen printing method as illustrated in FIGS. 3A to 3C. On the ceramic green sheet 3a illustrated in FIG. 3A, the electrode of the wiring line pattern 30, the end portion 31 connected to the electrode 4b, and the end portion 32 having a connection portion 6a connected to the via 6 are formed. By laminating the multiple ceramic green sheets 3a (e.g., six layers), the wiring line pattern 30 illustrated in FIGS. 2A and 2B are formed.

On the ceramic green sheet 3b illustrated in FIG. 3B, the electrode of the wiring line pattern 20, the end portion 21 connected to the electrode 4c, the end portion 22 having a connection portion 5b connected to the via 5, and the end portion 23 having a connection portion 6b connected to the via 6 are formed. By laminating the multiple ceramic green sheets 3b (e.g., three layers), the wiring line pattern 20 illustrated in FIGS. 2A and 2B is provided.

On the ceramic green sheet 3c illustrated in FIG. 3C, the electrode of the wiring line pattern 10, the end portion 11 connected to the electrode 4a, and the end portion 12 having a connection portion 5a connected to the via 5 are formed. By laminating the multiple ceramic green sheets 3c (e.g., six layers), the wiring line pattern 10 illustrated in FIGS. 2A and 2B is provided.

In the coil component 1, the multiple ceramic green sheets 3a, the multiple ceramic green sheets 3b, and the multiple ceramic green sheets 3c illustrated in FIGS. 3A to 3C are laminated on top of one another, and a plurality of ceramic green sheets on which no wiring line pattern is printed (dummy layers) are laminated on the top and bottom of these laminated ceramic green sheets. The multiple ceramic green sheets including the dummy layers are subjected to pressure bonding, so that the unfired laminate 3 (ceramic element body) is formed. The formed laminate 3 is fired, and the electrodes 4a to 4d are formed by baking copper electrodes on the outside of the fired laminate 3 such that the electrodes are electrically connected to the wiring line patterns.

In the coil component 1, a plurality of ceramic green sheets on which the wiring lines of the wiring line patterns 10, 20, and 30 defining the coils L1 and L2 are formed are laminated. Accordingly, by using a multilayer structure including the wiring line patterns 10, 20, and 30, the reduction in resistance and size of the coils L1 and L2 is realized in the coil component 1.

Figure 4A:
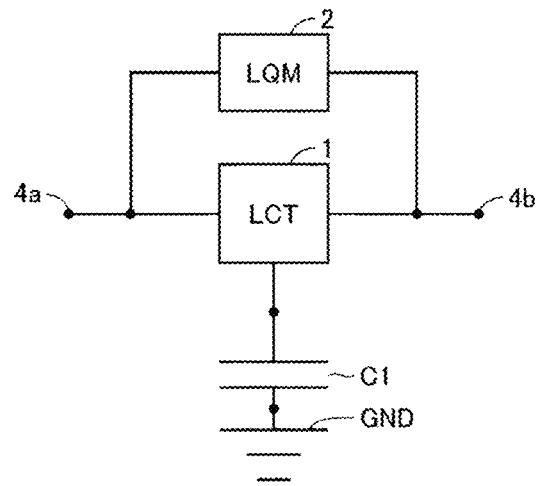
FIGS. 4A to 4C are block diagrams describing the configuration of a filter circuit.
Figure 4B:
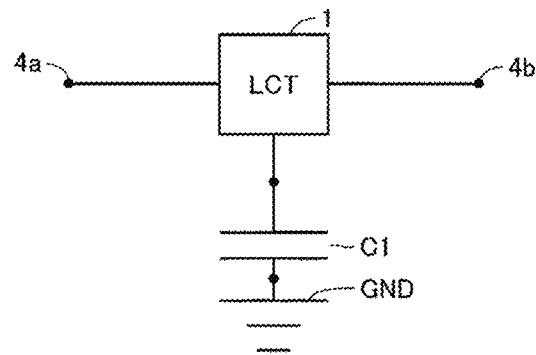
Figure 4C:
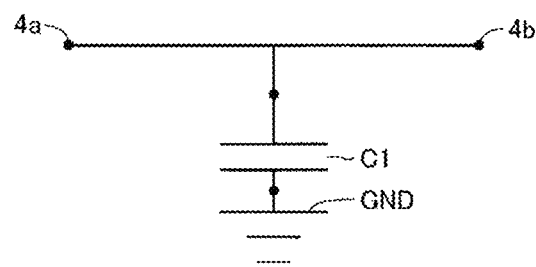

Next, the operation of the filter circuit 100 will be described in more details. FIGS. 4A to 4C are block diagrams describing the configuration of a filter circuit. FIG. 4A is a block diagram illustrating the configuration of the filter circuit 100 according to the present preferred embodiment. In the filter circuit 100 illustrated in FIG. 4A, the inductor (LQM) 2 is connected in parallel to the coil component (LCT) 1, and the coil component (LCT) 1 is connected to a GND electrode via the capacitor C1.

It is desired in the filter circuit 100 that the direct-current resistance value of the inductor 2 be less than a direct-current resistance value between one end of the coil L1 and one end of the coil L2 in the coil component 1 (hereinafter simply referred to as the direct-current resistance value of the coil component 1). For example, when the direct-current resistance value of the coil component 1 is about 40 mΩ, a ferrite bead having about 19 mΩ less than the direct-current resistance value of the coil component 1 is used as the inductor 2. Accordingly, a direct current flowing through the inductor 2 can be larger than that flowing through the coil component 1 in the filter circuit 100. For example, even when the rated current of the coil component 1 is 3 A, the filter circuit 100 can be applied to a power supply to supply the current of 9 A on condition that the current of 6 A can flow through the inductor 2.

It is desired in the filter circuit 100 that the impedance value of the inductor 2 be greater than an impedance value between one end of the coil L1 and one end of the coil L2 in the coil component 1 (hereinafter simply referred to as the impedance value of the coil component 1). For example, when the inductance value of the coil component 1 is about 8 nH, a ferrite bead having about 100 nH greater than the inductance value of the coil component 1 is used as the inductor 2 to obtain the impedance value of the inductor 2 greater than the impedance value of the coil component 1. Accordingly, an alternating-current noise component from a power supply which flows through the coil component 1 can be larger than that flowing through the inductor 2 in the filter circuit 100.

Figure 5:
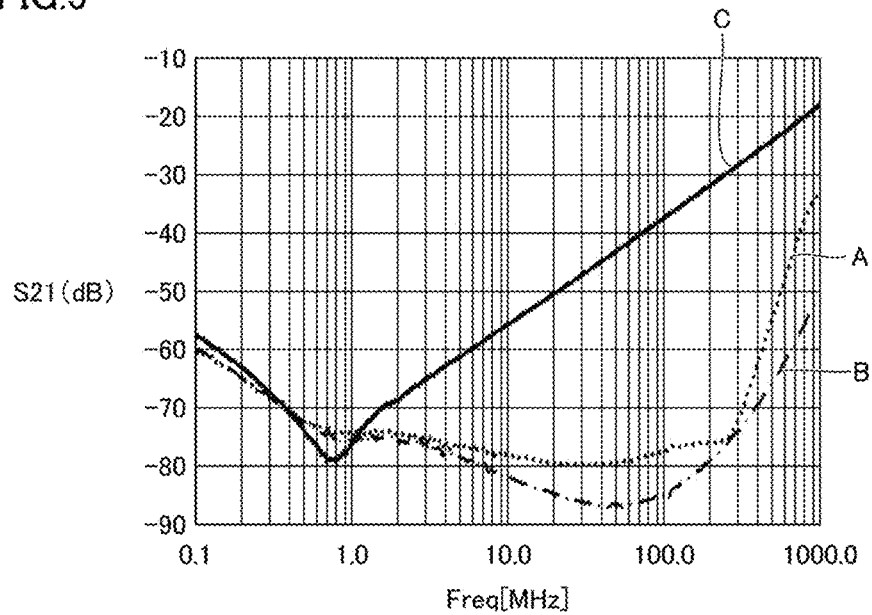
FIG. 5 is a graph indicating transmission characteristics with respect to the frequency of a filter circuit.

FIG. 5 is a graph indicating transmission characteristics with respect to the frequency of a filter circuit. FIG. 5 illustrates, as a graph, the result of depicting the transmission characteristic with respect to a frequency obtained from a circuit simulation performed for the filter circuit 100 illustrated in FIG. 4. In the graph illustrated in FIG. 5, the horizontal axis represents frequency Freq (MHz) and the vertical axis represents transmission characteristics S21 (dB).

First, graph A in FIG. 5 is a graph indicating the transmission characteristic obtained from a circuit simulation performed for the filter circuit 100 illustrated in FIG. 4A. The graph A indicates that transmission characteristics S21 are about −50 dB or less at frequencies Freq up to approximately 550.0 MHz and a noise signal in a high-frequency band including the FM band (several tens of MHz) can be suppressed at the frequencies Freq.

The graph A also indicates that the transmission characteristics S21 markedly increase at frequencies greater than approximately 300.0 MHz. The reason for this is that the inductor 2 has a self-resonant frequency due to a stray capacitance at approximately 300.0 MHz and the impedance value of the inductor 2 markedly decreases at frequencies greater than the self-resonant frequency. That is, in the filter circuit 100, an alternating-current noise component from a power supply easily flows to the inductor 2 at frequencies greater than approximately 300.0 MHz and the alternating-current noise component filtering effect of the coil component 1 is reduced.

Graph B in FIG. 5 is a graph indicating the transmission characteristic obtained from a circuit simulation performed for the filter circuit illustrated in FIG. 4B. FIG. 4B is a block diagram illustrating the configuration of a filter circuit that is a comparative example of the filter circuit 100. The filter circuit illustrated in FIG. 4B does not include the inductor 2 and includes the coil component 1 connected to the GND electrode via the capacitor C1.

The graph B indicates that the transmission characteristics S21 are about −50 dB or less at frequencies Freq up to approximately 1000.0 MHz and a noise signal in a high-frequency band including the FM band (several tens of MHz) can be suppressed at the frequencies Freq. The reason for this is that the filter circuit illustrated in FIG. 4B does not include the inductor 2 and is not therefore affected by the change in the impedance value of the inductor 2. However, a filter circuit not including the inductor 2 cannot pass a large current without a measure against large currents as described above.

Graph C in FIG. 5 is a graph indicating the transmission characteristic obtained from a circuit simulation performed for the filter circuit illustrated in FIG. 4C. FIG. 4C is a block diagram illustrating the configuration of a filter circuit that is a comparative example of the filter circuit 100. The filter circuit illustrated in FIG. 4C does not include the coil component 1 and the inductor 2 and includes the capacitor C1 between the power supply line and the GND electrode.

The graph C indicates that the transmission characteristics S21 are about −50 dB or less at frequencies Freq up to approximately 20.0 MHz but a noise signal in a high-frequency band including the FM band (several tens of MHz) cannot be suppressed at the frequencies Freq.

As is apparent from the results indicated by the graphs A to C illustrated in FIG. 5, the frequency band, in which a noise signal can be suppressed, of the filter circuit 100 illustrated in FIG. 4A becomes narrower than that of the filter circuit illustrated in FIG. 4B not including the inductor 2. However, the filter circuit 100 illustrated in FIG. 4A can sufficiently suppress a noise signal in a high-frequency band including the FM band (several tens of MHz) as compared with the filter circuit illustrated in FIG. 4C.

Figure 6:
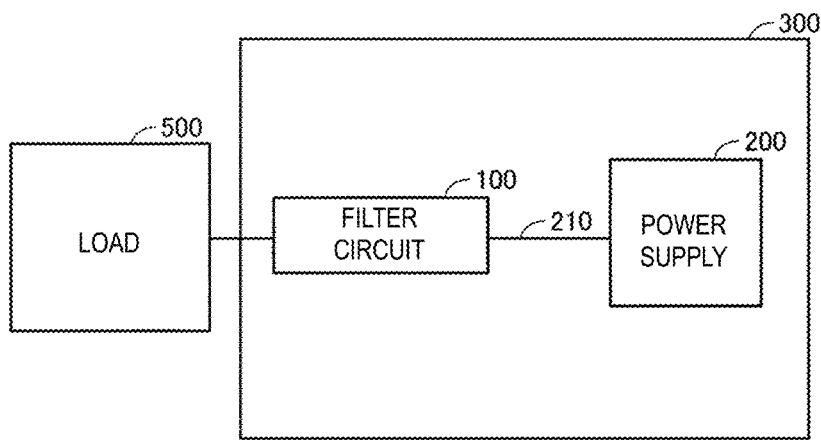
FIG. 6 is a block diagram describing the configuration of a power supply device according to a preferred embodiment of the present invention.

Next, a power supply device including the filter circuit 100 will be described. FIG. 6 is a block diagram describing the configuration of a power supply device according to the present preferred embodiment. A power supply device 300 supplies power to a load 500, such as a motor. The power supply device 300 includes a power supply 200, a power supply line 210 that connects the power supply 200 and the load 500, and the filter circuit 100 provided along the power supply line 210.

Since the filter circuit 100 can use the coil component 1 having a rated current smaller than a current flowing through the load 500 such as a motor, the coil component 1 can be reduced in size and cost. Accordingly, the power supply device 300 can remove an alternating-current noise component and flow a large current through the load 500 while the constraints of size and manufacturing cost are taken into consideration.

It is desired that the coil component 1 have the configuration in which the electrode 4a on the one-end side of the coil L1 illustrated in FIG. 1 and the electrode 4b on the one-end side of the coil L2 are connected in series to the power supply line. The inductor 2 is connected in parallel to the coil component 1 connected in series to the power supply line. Since the coil component 1 for filtering an alternating-current noise component can be connected in series to the power supply line, the filter circuit 100 has a higher effect of removing an alternating-current noise component for the power supply 200.

In the filter circuit 100, the coil component 1 may be used as the inductor 2. That is, the two coil components 1 are connected in parallel to each other in the filter circuit 100. The filter circuit 100 having this configuration can pass a current twice the rated current of the coil component 1 while increasing the effect of removing an alternating-current noise component.

However, in the case where the filter circuit 100 having this configuration passes a current more than twice the rated current of the coil component 1, the three or more coil components 1 need to be connected in parallel to each other. Accordingly, in the case where the filter circuit 100 passes a current more than twice the rated current of the coil component 1, the number of components and a manufacturing cost can be reduced by disposing the inductor 2 having an impedance value twice or greater than twice the impedance value of the coil component 1.

As described above, the filter circuit 100 according to the present preferred embodiment includes the coil component 1, the inductor 2, and the capacitor C1. In the coil component 1, the coils L1 and L2 are magnetically coupled. The inductor 2 is electrically connected to one end of the coil L1 and one end of the coil L2 and is connected in parallel to the coil component 1. The capacitor C1 is electrically connected between the GND electrode and the electrode 4c electrically connected to the other end of the coil L1 and the other end of the coil L2.

The filter circuit 100 according to the present preferred embodiment in which the inductor 2 is electrically connected to one end of the coil L1 and one end of the coil L2 and is connected in parallel to the coil component 1 can therefore pass a large current while the constraints of size and manufacturing cost are taken into consideration.

The coil component 1 includes the laminate 3 including a plurality of laminated insulating layers and the coils L1 and L2 laminated in the laminate 3. The coil component 1 further includes the electrode 4a that is located on the side surface of the laminate 3 and is electrically connected to one end of the coil L1 and the electrode 4b that is located on the side surface of the laminate 3 different from the side surface on which the electrode 4a is located and is electrically connected to one end of the coil L2. The coil component 1 further includes the electrode 4c that is located on the side surface of the laminate 3 different from the respective side surfaces on which the electrodes 4a and 4b are located and is electrically connected to the other end of the coil L1 and the other end of the coil L2. The coils L1 and L2 are preferably laminated in the laminate 3 such that the openings of the coils L1 and L2 overlap as viewed from the lamination direction of the laminate 3, and the electrode 4c is preferably electrically connected to one end of the capacitor C1. As a result, the coil component 1 in which the coils L1 and L2 are magnetically coupled can be manufactured at a low cost.

The direct-current resistance value of the inductor 2 is preferably less than the direct-current resistance value between one end of the coil L1 and one end of the coil L2 in the coil component 1. The filter circuit 100 can therefore flow a larger current to the inductor 2.

The impedance value of the inductor 2 is preferably greater than the impedance value between one end of the coil L1 and one end of the coil L2 in the coil component 1. Furthermore, the impedance value of the inductor 2 is preferably twice or greater than twice the impedance value between one end of the coil L1 and one end of the coil L2 in the coil component 1. The filter circuit 100 can therefore enable a larger alternating-current noise component to flow to the coil component 1.

In the configuration in which one end of the coil L1 and one end of the coil L2 in the coil component 1 are connected in series to the power supply line 210, the inductor 2 is preferably connected in parallel to the coil component 1 connected in series to the power supply line 210. The filter circuit 100 therefore has a higher effect of removing an alternating-current noise component for a power supply.

The coil component 1 and the inductor 2 are preferably disposed on a substrate such that the opening of a coil conductor in the inductor 2 does not overlap the openings of the coils L1 and L2 as viewed from the lamination direction of the laminate 3. The inductor 2 therefore simply functions as a current bypass path.

The power supply device 300 includes the power supply 200, the power supply line 210 that is connected to the power supply 200 and is configured to supply power to the load 500, and the filter circuit 100 connected to the power supply line 210. The power supply device 300 can therefore flow a large current to the load 500.

Modification

Each of the wiring line patterns 10, 20, and 30 is formed by laminating a plurality of wiring lines in the coil component 1 described above, but may be formed of a wiring line in a single layer.

The number of layers of laminated wiring lines of the wiring line pattern 20 is smaller than that of the wiring line pattern 10 and the wiring line pattern 30 in the coil component 1 described above, but may be the same as that of the wiring line pattern 10 and the wiring line pattern 30.

The coil component 1, the inductor 2, and the capacitor C1 in the filter circuit 100 are disposed on a substrate as described above. However, a configuration in which the coil component 1, the inductor 2, and the capacitor C1 are not disposed on a substrate may be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter circuit comprising:
   a coil component including a first coil conductor and a second coil conductor that are magnetically coupled;
   an inductor that is electrically connected to a first end of the first coil conductor and a first end of the second coil conductor and that is connected in parallel to the coil component; and
   a capacitor that is electrically connected between a ground electrode and an electrode electrically connected to a second end of the first coil conductor and a second end of the second coil conductor; wherein
   a direct-current resistance value of the inductor is less than a direct-current resistance value between the first end of the first coil conductor and the first end of the second coil conductor in the coil component;
   an impedance value of the inductor is twice or greater than twice an impedance value between the first end of the first coil conductor and the first end of the second coil conductor in the coil component; and
   in a configuration in which the first end of the first coil conductor and the first end of the second coil conductor in the coil component are connected in series to a power supply line, the inductor is connected in parallel to the coil component connected in series to the power supply line.

2. The filter circuit according to claim 1, wherein the coil component includes:
   an element body including a plurality of laminated insulating layers;
   the first coil conductor and the second coil conductor laminated in the element body;
   a first electrode on a first side surface of the element body and electrically connected to the first end of the first coil conductor;
   a second electrode on a second side surface of the element body and electrically connected to the first end of the second coil conductor; and
   a third electrode on a third side surface of the element body and electrically connected to the second end of the first coil conductor and the second end of the second coil conductor; wherein
   the first coil conductor and the second coil conductor are laminated in the element body such that an opening of the first coil conductor and an opening of the second coil conductor overlap each other as viewed from a lamination direction of the element body; and
   the third electrode is electrically connected to one end of the capacitor.

3. The filter circuit according to claim 2, wherein the coil component and the inductor are provided on a substrate such that an opening of a coil conductor included in the inductor does not overlap the opening of the first coil conductor and the opening of the second coil conductor as viewed from the lamination direction of the element body.

4. The filter circuit according to claim 1, wherein the filter circuit is a third-order T-type LC filter circuit, a fifth-order T-type LC filter circuit, or a higher order T-type LC filter circuit.

5. The filter circuit according to claim 1, wherein the capacitor is a multilayer ceramic capacitor or an aluminum electrolytic capacitor.

6. The filter circuit according to claim 1, wherein the inductor is a chip coil or a ferrite bead.

7. The filter circuit according to claim 1, wherein the coil component includes first, second and third wiring line patterns defining the first and second coil conductors.

8. The filter circuit according to claim 7, wherein each of the first, second, and third wiring line patterns include a plurality of wiring lines, and a number of wiring lines of the second wiring line pattern is less than that of the first wiring line pattern and the third wiring line pattern.

9. The filter circuit according to claim 7, wherein each of the first, second, and third wiring line patterns include a plurality of wiring lines, and a number of wiring lines of the first wiring line pattern, the second wiring line pattern, and the third wiring line pattern is the same.

10. The filter circuit according to claim 7, wherein the first, second, and third wiring line patterns are provided on respective ceramic layers.

11. The filter circuit according to claim 1, wherein the inductor is a coil component including a third coil conductor and a fourth coil conductor that are magnetically coupled.

12. An EMI suppression filter comprising the filter circuit according to claim 1.

13. A power supply device comprising:
   a power supply;
   a power supply line that is connected to the power supply to supply power to a load; and
   the filter circuit according to claim 1, the filter circuit being connected to the power supply line.

14. A motor comprising the power supply device according to claim 13.

* * * * *